United States Patent [19]
Deschamps et al.

[11] Patent Number: 5,142,412
[45] Date of Patent: Aug. 25, 1992

[54] CIRCUIT FOR CONTROLLING A RATION METER

[75] Inventors: Hervé Deschamps, Clichy; Michel Granjoux, Meudon; Bernard Marteau, Igny, all of France

[73] Assignee: Jaeger, Levallois Perret, France

[21] Appl. No.: 452,642

[22] Filed: Dec. 19, 1989

[30] Foreign Application Priority Data

| Dec. 19, 1988 | [FR] | France | 88 16757 |
| Dec. 19, 1988 | [FR] | France | 88 16758 |
| Dec. 19, 1988 | [FR] | France | 88 16759 |

[51] Int. Cl.⁵ .......................................... G06F 15/20
[52] U.S. Cl. .................................. 364/556; 324/166; 364/565
[58] Field of Search ...................... 364/550, 565, 556; 324/165, 166, 167, 169, 82, 85, 78 D, 174, 115, 140 R; 73/504, 520, 517 R; 340/670, 672

[56] References Cited

U.S. PATENT DOCUMENTS

| 3,636,447 | 1/1972 | Gelenius | 324/140 R |
| 3,868,570 | 2/1975 | Kopera, Jr. | 324/166 |
| 3,946,311 | 3/1976 | Baker et al. | 324/167 |
| 3,976,860 | 8/1976 | Gerstenmeier et al. | |
| 4,051,434 | 9/1977 | Sweet | 324/166 |
| 4,057,756 | 11/1977 | Ley et al. | 324/78 D |
| 4,070,665 | 1/1978 | Glennon et al. | 364/852 |
| 4,230,984 | 10/1980 | Taylor | 324/167 |
| 4,356,445 | 10/1982 | Congdon | 324/82 |
| 4,491,007 | 11/1985 | Crowdes, Jr. | 324/166 |
| 4,553,093 | 11/1985 | Chikasue | 324/166 |
| 4,742,297 | 5/1988 | Heaton et al. | 324/166 |
| 4,795,972 | 1/1989 | Roppelt et al. | 324/115 |
| 4,890,057 | 12/1989 | Kobayashi et al. | 324/166 |
| 4,928,060 | 5/1990 | Ito | 324/166 |
| 4,939,675 | 7/1990 | Luitje | 324/166 |

FOREIGN PATENT DOCUMENTS

0218737  4/1987  European Pat. Off.
2045953 11/1980  United Kingdom.

Primary Examiner—Kevin J. Teska
Attorney, Agent, or Firm—Pollock, Vande Sande & Priddy

[57] ABSTRACT

A circuit for controlling a ratio meter, the circuit having an input stage for generating a digital signal representative of a parameter to be displayed, memory to enable the digital signal to be encoded on the basis of a pre-defined sine, cosine, or tangent function, with the memory being addressed by intermediate significant bits in the digital signal, and an interpolator for correcting the signal from the memory on the basis of the least significant bits of the digital signal.

61 Claims, 7 Drawing Sheets

FIG_1

FIG_2

Maximum acceptable input frequencies

| $h_3$ \ $2^\Delta$ | 1 | 2 | 3 | 4 |
|---|---|---|---|---|
| 63 | 129.0079 | 258.0158 | 516.0315 | 1032.063 |
| 62 | 130.0318 | 260.0635 | 520.127 | 1040.254 |
| 61 | 131.072 | 262.144 | 524.288 | 1048.576 |
| 60 | 132.129 | 264.2581 | 528.5161 | 1057.032 |
| 59 | 133.2033 | 266.4065 | 532.813 | 1065.626 |
| 58 | 134.2951 | 268.5902 | 537.1803 | 1074.361 |
| 57 | 135.405 | 270.8099 | 541.6198 | 1083.24 |
| 56 | 136.5333 | 273.0667 | 546.1334 | 1092.267 |
| 55 | 137.6807 | 275.3614 | 550.7227 | 1101.445 |
| 54 | 138.8475 | 277.6949 | 555.3898 | 1110.78 |
| 53 | 140.0342 | 280.0684 | 560.1368 | 1120.274 |
| 52 | 141.2414 | 282.4828 | 564.9655 | 1129.931 |
| 51 | 142.4696 | 284.9391 | 569.8783 | 1139.757 |
| 50 | 143.7193 | 287.4386 | 574.8772 | 1149.754 |
| 49 | 144.9912 | 289.9823 | 579.9646 | 1159.929 |
| 48 | 146.2857 | 292.5715 | 585.1429 | 1170.286 |
| 47 | 147.6036 | 295.2072 | 590.4145 | 1180.829 |
| 46 | 148.9455 | 297.8909 | 595.7818 | 1191.564 |
| 45 | 150.3119 | 300.6239 | 601.2477 | 1202.495 |
| 44 | 151.7037 | 303.4074 | 606.8148 | 1213.63 |
| 43 | 153.1215 | 306.243 | 612.486 | 1224.972 |
| 42 | 154.566 | 309.1321 | 618.2642 | 1236.528 |
| 41 | 156.0381 | 312.0762 | 624.1524 | 1248.305 |
| 40 | 157.5385 | 315.0769 | 630.1539 | 1260.308 |
| 39 | 159.068 | 318.1359 | 636.2719 | 1272.544 |
| 38 | 160.6275 | 321.2549 | 642.5098 | 1285.02 |
| 37 | 162.2178 | 324.4357 | 648.8713 | 1297.743 |
| 36 | 163.84 | 327.68 | 655.36 | 1310.72 |
| 35 | 165.495 | 330.9899 | 661.9798 | 1323.96 |
| 34 | 167.1837 | 334.3674 | 668.7347 | 1337.469 |
| 33 | 168.9072 | 337.8144 | 675.6289 | 1351.258 |
| 32 | 170.6667 | 341.3334 | 682.6667 | 1365.333 |
| 31 | 172.4632 | 344.9263 | 689.8527 | 1379.705 |
| 30 | 174.2979 | 348.5957 | 697.1915 | 1394.383 |
| 29 | 176.172 | 352.3441 | 704.6882 | 1409.376 |
| 28 | 178.087 | 356.1739 | 712.3478 | 1424.696 |
| 27 | 180.044 | 360.0879 | 720.1758 | 1440.352 |
| 26 | 182.0445 | 364.0889 | 728.1778 | 1456.356 |
| 25 | 184.0899 | 368.1798 | 736.3596 | 1472.719 |
| 24 | 186.1818 | 372.3637 | 744.7273 | 1489.455 |
| 23 | 188.3218 | 376.6437 | 753.2874 | 1506.575 |
| 22 | 190.5116 | 381.0233 | 762.0465 | 1524.093 |
| 21 | 192.753 | 385.5059 | 771.0118 | 1542.024 |
| 20 | 195.0476 | 390.0953 | 780.1905 | 1560.381 |
| 19 | 197.3976 | 394.7952 | 789.5903 | 1579.181 |
| 18 | 199.8049 | 399.6098 | 799.2195 | 1598.439 |
| 17 | 202.2716 | 404.5432 | 809.0865 | 1618.173 |
| 16 | 204.8 | 409.6 | 819.2 | 1638.4 |
| 15 | 207.3924 | 414.7848 | 829.5696 | 1659.139 |
| 14 | 210.0513 | 420.1026 | 840.2051 | 1680.41 |
| 13 | 212.7792 | 425.5585 | 851.1169 | 1702.234 |
| 12 | 215.579 | 431.1579 | 862.3158 | 1724.632 |
| 11 | 218.4534 | 436.9067 | 873.8134 | 1747.627 |
| 10 | 221.4054 | 442.8108 | 885.6216 | 1771.243 |
| 9 | 224.4384 | 448.8767 | 897.7534 | 1795.507 |
| 8 | 227.5556 | 455.1111 | 910.2222 | 1820.445 |
| 7 | 230.7606 | 461.5211 | 923.0422 | 1846.085 |
| 6 | 234.0572 | 468.1143 | 936.2286 | 1872.457 |
| 5 | 237.4493 | 474.8986 | 949.7971 | 1899.594 |
| 4 | 240.9412 | 481.8824 | 963.7647 | 1927.529 |
| 3 | 244.5373 | 489.0746 | 978.1492 | 1956.299 |
| 2 | 248.2424 | 496.4849 | 992.9698 | 1985.94 |
| 1 | 252.0616 | 504.1231 | 1008.246 | 2016.492 |
| 0 | 256 | 512 | 1024 | 2048 |

FIG_3

FIG_4

FIG_5

| Contents of the means 310 | Address |
|---|---|
| 0 | 1 |
| 0.088 | 2 |
| 0.195 | 3 |
| 0.290 | 4 |
| 0.383 | 5 |
| 0.471 | 6 |
| 0.556 | 7 |
| 0.634 | 8 |
| 0.707 | 9 |
| 0.773 | 10 |
| 0.831 | 11 |
| 0.882 | 12 |
| 0.924 | 13 |
| 0.957 | 14 |
| 0.98 | 15 |
| 0.995 | 16 |

FIG_6

FIG_7

FIG_8A

| 2 MOST SIGNIFICANT BITS IN OUTPUT FROM 250 | | CURRENT FLOW DIRECTION | CONDUCTING TRANSISTORS |
|---|---|---|---|
| SQ (1) | SQ (0) | | |
| 0 | 0 | B10→B11, B20→B21 | T1, T4, T3, T6 |
| 0 | 1 | B10→B11, B21→B20 | T1, T4, T2, T7 |
| 1 | 0 | B11→B10, B21→B20 | T0, T5, T2, T7 |
| 1 | 1 | B11→B10, B20→B21 | T0, T5, T3, T6 |

FIG_8B

FIG_9

FIG_11

FIG.10

CIRCUIT FOR CONTROLLING A RATION METER

FIELD OF THE INVENTION

The present invention relates to ratio meters, i.e. devices comprising a plurality of crossed coils (and preferably two coils crossed at 90°), a shaft guided in rotation, a permanent magnet fixed to the shaft and placed inside the coils, an indicator needle external to the coils and fixed to the shaft, and control means applying appropriate electrical signals to the coils.

BACKGROUND OF THE INVENTION

Ratio meters usually also include a fixed vessel containing a damping liquid with the magnet being immersed therein.

Each of the coils generates a magnetic field proportional to the current passing therethrough. The magnet takes up a position along the resultant of the fields. For a two-coil ratio meter, the angle defined by the indicator needle relative to an origin position is thus determined by the relationship $\tan^{-1}(I_1/I_2)$ in which $I_1$ and $I_2$ represent values proportional to the ampere-turns carried by each of the coils.

In the car industry, large-deflection ratio meters are generally used for displaying a speed or a number of engine revolutions per minute. Large-deflection ratio meters generally include a return coil spring fixed to the shaft.

The structure and operation of ratio meters are well known to the person skilled in the art and are therefore not described in greater detail below.

The present invention relates more particularly to the control means designed for applying appropriate electrical signals to the coils of a ratio meter.

Numerous control means have already been proposed for this purpose, for example in the following patent documents: U.S. Pat. No. 2,057,845, DE-A-853 181, U.S. Pat. No. 2,500,628, U.S. Pat. No. 3,168,689, U.S. Pat. No. 3,327,208, U.S. Pat. No. 3,329,893, U.S. Pat. No. 3,624,625, U.S. Pat. No. 3,636,447, U.S. Pat. No. 3,732,436, U.S. Pat. No. 3,946,311, U.S. Pat. No. 4,051,434, U.S. Pat. No. 4,070,665, DE-A-2 924 617, U.S. Pat. No. 4,230,984, and EP-A-0 218 737.

The object of the present invention is to provide novel control means enabling ratio meter accuracy to be improved while remaining simple in structure and reasonable in price.

Another object of the present invention is to provide control means making it possible to operate with a display over 360°.

SUMMARY OF THE INVENTION

In a first aspect of the present invention, the above-mentioned objects are achieved by control means comprising a circuit for controlling a ratio meter, the circuit comprising means suitable for generating a digital signal representative of a parameter to be displayed, memory means enabling the digital signal to be encoded on the basis of a pre-defined sine, cosine, or tangent function, with the memory means being addressed by bits of intermediate significance in the digital signal, and interpolation means suitable for correcting the signal from the memory means on the basis of the least significant bits of the digital signal.

In a second aspect, the above-mentioned objects are achieved by ratio meter control means that make use of an input signal whose frequency is proportional to a parameter to be displayed, and to this end comprise a counter which receives a clock signal at fixed frequency on its clock input, and a signal whose frequency is related to the frequency of the input signal, such that the counter counts clock pulses during the period of the signal applied to its control input; and a divider which divides a programmable constant by the signal delivered from the counter so as to provide a digital signal at the output of the divider representative of the frequency of the input signal.

In a third aspect, these objects are achieved by the present invention by control means including a module which is sensitive to the slope of the signal representative of a parameter to be displayed.

BRIEF DESCRIPTION OF THE DRAWINGS

Other characteristics, objects, and advantages of the present invention appear from reading the following detailed description made with reference to the accompanying drawings given by way of non-limiting example, and in which.

DETAILED DESCRIPTION OF THE INVENTION

Figure 1:
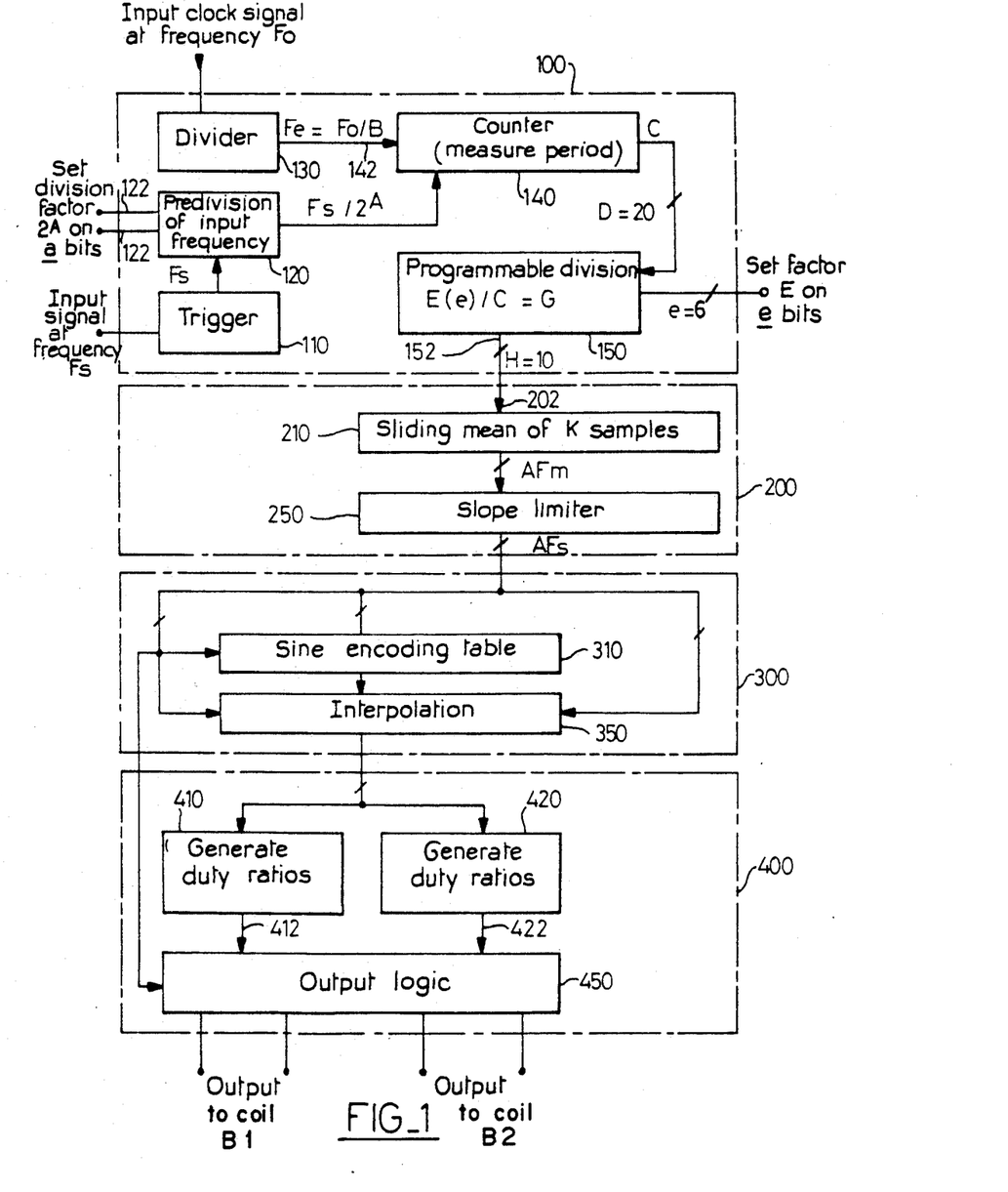
FIG. 1 is a block diagram of control means in accordance with a preferred implementation of the present invention.

The control means of a preferred implementation of the present invention and shown in accompanying FIG. 1 essentially comprise an input stage 100 for generating a digital signal representative of the frequency of an input signal Fs, which frequency Fs is itself proportional to the parameter to be displayed, an intermediate processing stage 200, an encoding stage 300, and an output stage 400.

In FIG. 1, the input stage 100 comprises an input trigger module 110, a predivider module 120, a clock frequency divider module 130, a counter 140 operating as a period meter, and a programmable divider 150.

The input signal whose frequency Fs represents the parameter to be displayed is applied to the trigger module 110.

The trigger module performs the function, known per se, of shaping the input signal so that it has the form of rectangular logic pulses at the same frequency Fs.

The signal from the trigger module 110 is applied to the predivider module 120. This module divides the input frequency Fs by a factor $2^A$ where A is an integer lying in the range 0 to $2^a-1$, and is programmable via a inputs 122 to the module 120. The division factor $2^A$ can thus take up $2^a$ values. The signal obtained at the output from the predivider 120 is at a frequency $Fs/2^A$.

In the example shown in accompanying FIG. 1, the predivider 120 has a=2 programming inputs 122. It may therefore divide the input frequency Fs by 1, 2, 4, or 8, as required.

The control means use a clock signal at a fixed frequency Fo. The clock signal may be generated by a conventional crystal oscillator (not shown in the accompanying figures).

The input clock signal is preferably applied to a frequency divider 130. This divides the input frequency of the clock Fo by a factor B so as to provide an appropriate driver clock signal at the output from the divider 130 at a frequency Fe=Fo/B.

The driver clock signal from the divider 130 is applied to the count input 142 of the counter 140.

The counting periods of the counter 140 are determined by the signal from the predivider 120, i.e. the counter 140 counts the number C of pulses delivered by the divider 130 at the frequency Fe between two consecutive same-type edges, e.g. rising edges, in the signal delivered at the frequency $Fs/2^A$ from the predivider 120. The counter 140 thus operates to measure periods. It has D bits, e.g. 20 bits. If the most significant bit of the counter 140 switches to high level, then the frequency of the input signal is lower than the minimum acceptable frequency.

The digital value C present at the output from the counter 140 is renewed on each active edge, e.g. each rising edge, in the signal from the predivider 120 and is transferred to the divider 150 on each request therefrom.

The divider 150 divides a programmable constant E by the input magnitude C from the counter 140. It provides the result G of the division E/C on its output 152.

The constant E is programmed on e inputs to the divider 150, e.g. on 6 inputs, in such a manner that at the highest acceptable value of the input frequency Fs, dividing E by the digital value C corresponds to the maximum angle of deflection.

The divider 150 provides the signal G on H bits, e.g. on 10 bits.

The number H of bits at the output from the divider 150 is determined by the relationship H>log(360/I)/log2, where I represents the desired display resolution.

The capacity of the counter 140, and thus the number D of output bits therefrom, is selected as a function of the clock frequency Fe and of the minimum acceptable frequency.

The number a of bits in the predivider 120 determining the largest possible predivision factor $2^{(2a-1)}$ is selected as a function of the range of input frequencies to be processed.

In accordance with the invention, a minimum number d of bits is imposed at the output from the counter 140 for the minimum counting period Cmin, such that at the maximum value of the input frequency Fs, FsMax, d=H+1.

In the above example, if the number H of output bits from the divider 150 is equal to 10, then Cmin should be chosen to occupy at least 11 bits, i.e. Cmin≧2048.

More precisely, the predivision factor $2^A$ used in the predivider 120 is chosen so that $2^{H-1} \leq Cmin < 2^{H+2}$, i.e. 2048≦Cmin<4096 in the present example.

Further, E is encoded such that $E(e)=2^H[2^{h1}(2^{h2}+h_3)]$, in which:

$h_3$ is an integer lying in the range 0 to $2^e-1$;
h1 and h2 are integers such that h1+h2=H+1; and
$h_2=e$.

In the particular example above, which is naturally not limiting, the following values apply:

a (number of bits in the predivider 120)=2;
possible frequency division factors $2^A$ in the predivider 120: 1, 2, 4, or 8;
frequency Fo of the input clock signal=4.194304 MHz;
division factor B of divider 130=8;
frequency Fe of the driver clock signal=524288 Hz;
number of bits in counter 140: 20;
number of bits e for programming the constant E: 6;
number of bits in divider 150: 10;
value of the constant E:

$$2^{10}[2^5(2^6+h_3)]=2^{15}(64+h_3);$$

maximum angle of deflection: 360°;
resolution: 0.35°;
input frequency range corresponding to a deflection of 360°: 129 Hz to 2048 Hz; and
accuracy on full scale deflection better than ±0.75%.

Figure 2:
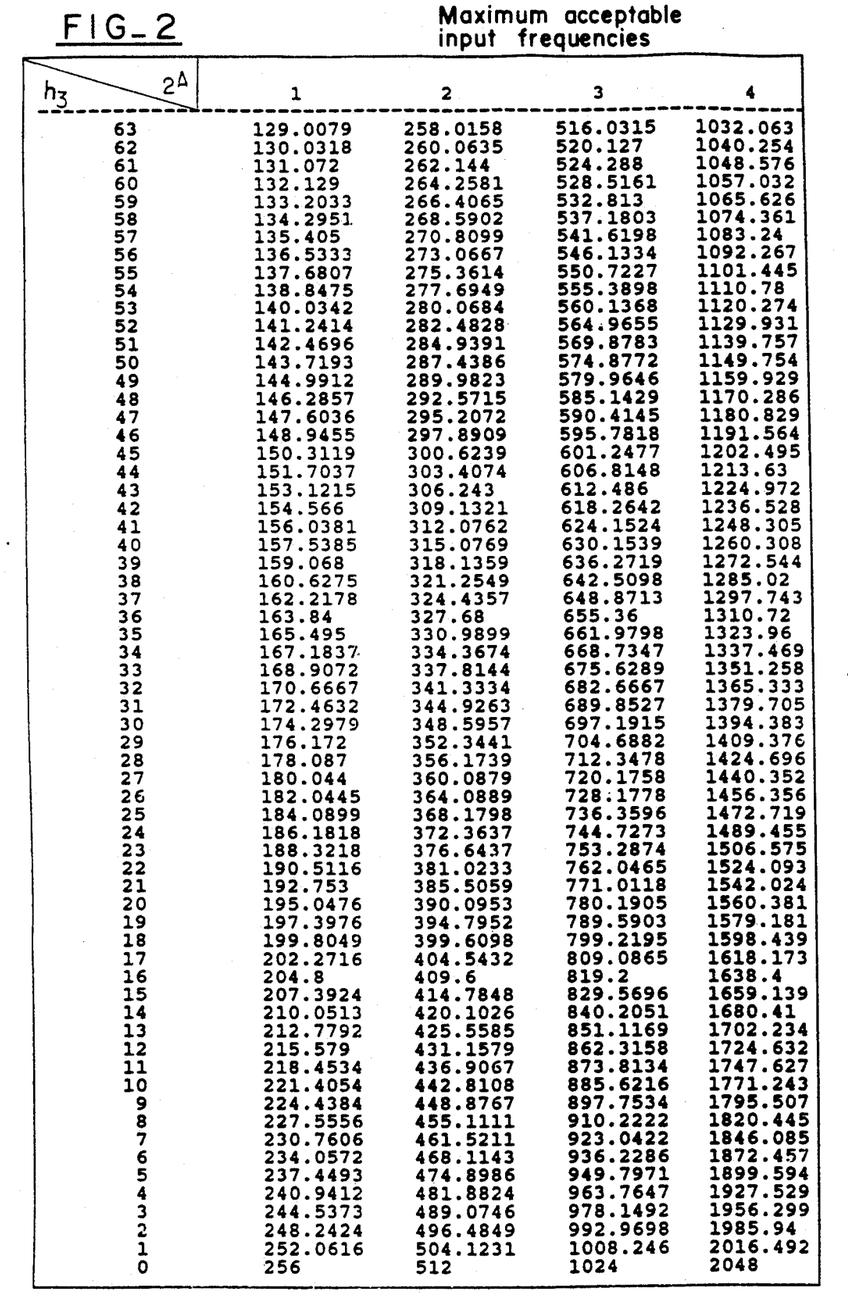
FIG. 2 is a table of maximum acceptable frequency values as a function of data programmed on the inputs of the circuit.

The accompanying table in FIG. 2 specifies what factors $2^A$ and $h_3$ need to be set by means of the respective numbers of control bits a and e in order to obtain a full-scale deflection of 360° at the maximum input frequency FsMax in the context of the example given. For example, for FsMax=655.36 Hz, the a bits of the module 120 are programmed such that $2^A=4$ and the e bits of the module 150 are programmed such that $h_3=36$.

Similar tables may be determined for other embodiments by calculating values of $FsMax=Fe \times 2^A/[2^{h1}(2^{h1}(2^{h2}+h_3)]$ as a function of a and e.

Figure 3:
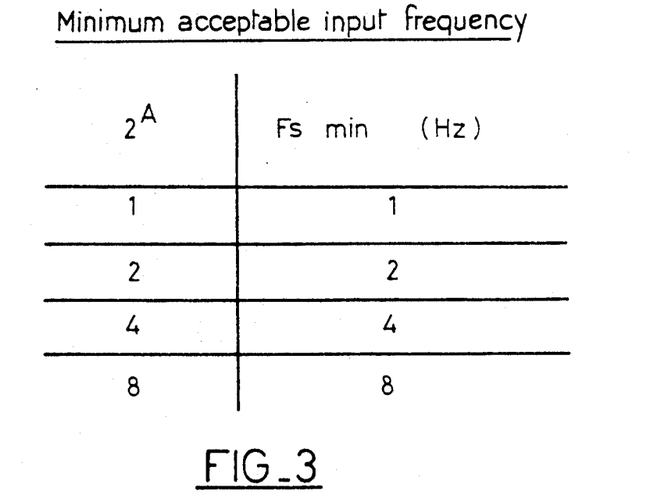
FIG. 3 is a table of minimum acceptable frequency values as a function of data programmed on the inputs of the circuit.

The table in accompanying FIG. 3 shows the minimum acceptable frequency for the input signal Fs as a function of the predivision factor $2^A$. This minimum frequency corresponds to the maximum measurable period as determined by the D-th bit of the counter 140 being activated.

An H-bit digital signal is obtained from the output of the divider 150 which is proportional to the frequency of the input signal and to the desired angle of deflection of the ratio meter.

The signal obtained at the output from the programmable divider 150 is applied to the processing stage 200.

This stage comprises both a module 210 which establishes a sliding average on K bits, and a slope-limiting module 250.

Figure 4:
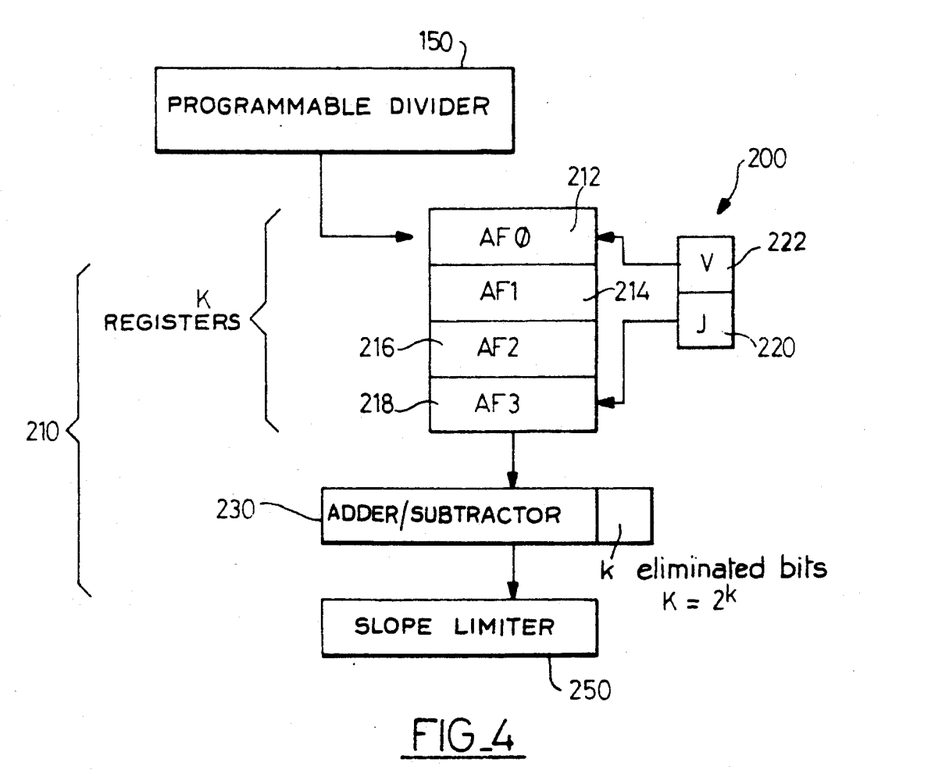
FIG. 4 is a block diagram showing sample smoothing.

As shown in FIG. 4, the module 210 comprises, for this purpose, K registers 212, 214, 216, and 218, two pointers 220 and 222, and an adder/subtractor 230. The signals from the output of the divider 150 are applied successively to the registers 212, 214, 216, and 218. The pointer 220 contains the address of the register 212 to 218 having most recently received the signal from the divider 150. The pointer 222 contains, on the contrary, the address of the register 212 to 218 which receives the first signal from the divider 150. The adder/subtractor 130 contains a number equal to the sum of the contents of the K registers 212 to 218.

When a new value is presented at the output of the programmable divider 150, the contents of that one of the registers 212 to 218 which is identified by the pointer 222 is subtracted from the contents of the adder/subtractor 230, the addresses of the pointers 220 and 222 are incremented through one step, the new value available at the output from the divider 150 is inserted in that one of the registers 212 to 218 which is identified by the pointer 220, and the contents of said register is added to the contents of the adder/subtractor 130.

Assuming that the programmable divider 150 provides an H-bit output signal, and that the module 210 takes a sliding average over four samples and therefore contains four registers 212 to 218, the adder/subtractor 230 contains H+2 bits, i.e. 12 bits in the present example where the divider 150 provides its signal on 10 bits. The contents of the adder/subtractor 130 is transferred after each of the above-mentioned subtraction-and-addition operations to the module 250, with a shift to the right through k bits such that $K = 2^k$. In other words, the k least significant bits of the contents of the adder/subtractor 230 are eliminated on transfer to the module 250.

Figure 5:
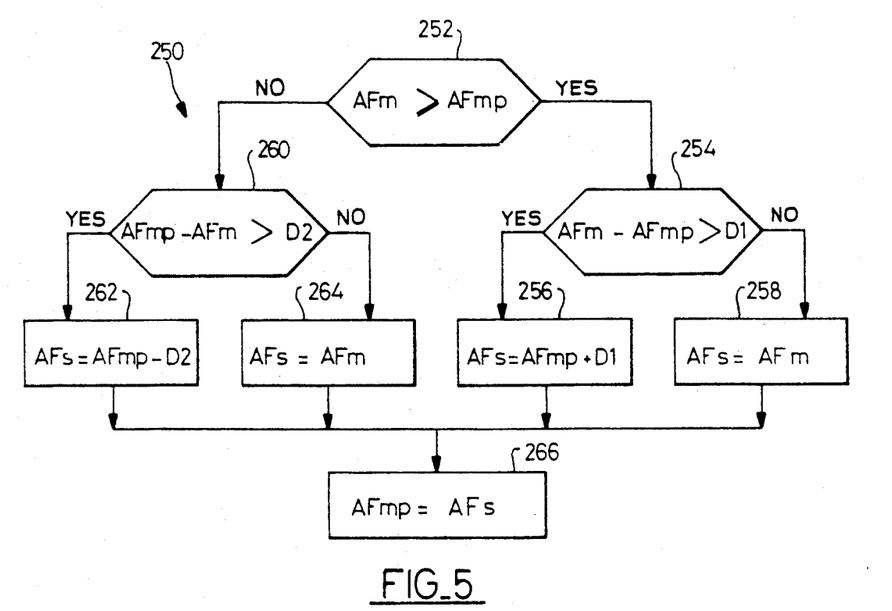
FIG. 5 is a flow chart showing slope limitation.

The function of the module 250 is to limit the slope of the signal. It proceeds as shown in FIG. 5 by comparing the mean value, i.e. AFm provided at any given instant at the output from the module 210 with the corresponding preceding value, designated AFmp.

For this purpose, the value AFmp is stored in an appropriate register or memory cell. The module 250 provides a signal AFs at its output.

If at step 252, the module 250 determines that AFm$\geq$AFmp, the slope of the signal is increasing and the system goes to step 254 during which the module 250 compares the difference (AFm−AFmp) with a predetermined threshold D1.

If AFm−AFmp>D1, the increasing slope of the signal is greater than the threshold allowed, so the module 250 forces AFs to equal AFmp+D1 during step 256.

In contrast, if during step 254 the module 250 determines that AFm−AFmp$\leq$D1, then the system moves to step 258 which makes the signal AFs equal to AFm.

If during step 252, the module 250 determines that AFm<AFmp, then the signal slope is decreasing and the system moves onto step 260 during which the module 250 compares the difference (AFmp−AFm) with a predetermined threshold D2.

If AFmp−AFm>D2, then the decreasing slope of the signal exceeds the threshold allowed D2, so the module 250 then forces Afs to equal Afmp−D2 during step 262.

However, if during step 260, the module 250 determines that Afmp−Afm$\leq$D2, then the system moves to step 264 which makes the signal AFs equal to AFm.

At step 266, the previously stored mean value AFmp is refreshed to take up the new value AFs. This value is directed to the encoding module 300. The encoding module 300 includes memory means 310 and an interpolator 350. The memory means 310 are preferably constituted by a read only memory (ROM), but they could be constituted by any functioning equivalent means, e.g. by a programmed logic array (PLA) as described, for example, in "Integrated Circuit Engineering—Glaser and Subak—Sharpe, Addison—Wesley page 726", or by a combinatory logic structure using gates.

The value of AFs is provided at the output of the module 250 on R bits, e.g. on 10 bits, and is applied to the encoding stage 300.

For full scale deflection over 360°, the two most significant bits of the signal AFs, designated SQ(1) and SQ(0) below, encode the quadrant, i.e. arbitrarily, a first quadrant for SQ(1)=0 and SQ(0)=0, a second quadrant for SQ(1)=0 and SQ(0)=1, a third quadrant for SQ(1)=1 and SQ(0)=0, and a fourth quadrant for SQ(1)=1 and SQ(0)=1.

The r1 intermediate significant bits, e.g. r1=4, are used for addressing the memory means 310.

The r2 least significant bits of the signal AFs, e.g. r2=4, are used for driving the interpolator 350.

The memory means 310 contain $2^{r1}$ M-bit words representing the values of $\sin[90° \times N]/2^{r1}$ where N is an integer lying in the range 1 to $2^{r1}$.

Thus, address N in the memory means 310 contains the value of the sine of $[(90° \times N)/2^{r1}]$, and address $(2^{r1} - N)$ contains the value of the cosine of $[(90° \times N)/2^{r1}]$.

Figure 6:
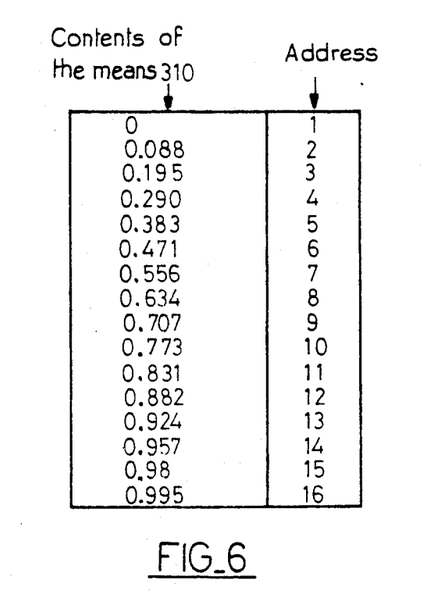
FIG. 6 shows values corresponding to a sine/cosine law and contained in a table in memory.

Assuming that r1=4, accompanying FIG. 6 shows the $2^{r1} = 16$ values stored in the mean 310 at the addresses N.

Figure 8A:
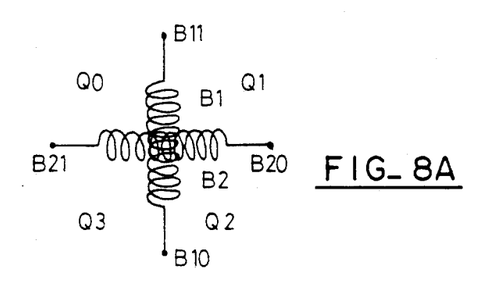
FIG. 8A is a diagram of the coil.

It is assumed in the description below that the ratio meter has two coils B1 and B2 crossed at 90° and intended to receive respective sine and cosine type signals, as shown on FIG. 8A. On said FIG. 8A the terminals of coil B1 are referenced B10 and B11, while the terminals of coil B2 are referenced B20 and B21. Moreover, the four quadrants are referenced Q0, Q1, Q2 and Q3 on FIG. 8A.

The means 310 are associated with a pointer logic circuit driven by the two most significant output bits SQ(1) and SQ(0) from the module 250.

In order to generate sine signals for application to coil B1, the pointer logic circuit reads the value contained in address N if the second most significant SQ(0) is 0, otherwise it reads the value contained at address $(2^{r1} - N)$ if the second most significant bit SQ(0) is at 1.

Similarly, for generating cosine type signals for applications to coil B2, the pointer logic circuit reads the value contained at address $(2^{r1} - N)$ if the second most significant SQ(0) is at 0, and it reads the value contained at address N if the second most significant bit SQ(0) is at 1.

The values read this way by the pointer logic circuit are approximations respectively to the sine and the cosine of the desired angle of deflection.

These values are subsequently refined in the interpolation module 250 on the base of the r2 least significant bits from the module 250.

The interpolation module 350 operates as follows, using the following symbols: R(N) represents the contents of the means 310 at address N; IP represents the decimal value corresponding to the r2 least significant bits from the module 250; and Rcs is a sine signal and Rcc is a cosine signal as calculated by the module 350:

a) if SQ(1)=0 and SQ(0)=0, i.e. the first quadrant, or if SQ(1)=1 and SQ(0)=0, i.e. for the third quadrant, then:

$$Rcs = R(N) + IP[R(N+1) - R(N)]/2^{r1}; \text{ and}$$

$$\text{if } N=1, Rcc = 1 - IP[1 - R(2^{r1} - 1)]/2^{r1}; \text{ or}$$

$$\text{if } N \neq 1,$$
$$Rcc = R(2^{r1} - N) - IP[R(2^{r1} - N) - R(2^{r1} - 1 - N)]/2^{r1};$$

b) if SQ(1)=0 and SQ(0)=1, i.e. in the second quadrant, or if SQ(1)=1 and SQ(0)=1, i.e. in the fourth quadrant, then:

if $N=1$, $Rcs = 1 - IP[1 - R(2^{r_1} - 1)]/2^{r_1}$; or if $N \neq 1$,
$Rcs = R(2^{r_1} - N) - IP[R(2^{r_1} - N) - R(2^{r_1} - 1 - N)]/2^{r_1}$;

$Rcc = R(N) - I[R(N+1) - R(N)]/2^{r_1}$.

The sine and cosine representing signals from the interpolation module 350 are applied to the output stage 400.

The output stage comprises two modules 410 and 420 which determine the duty ratios related to the signals applied to the input of the stage 400, and an output logic module 450.

The modules 410 and 420 are constituted by down-counting registers. Periodically, at period $T_{Rc}$, the signals from the interpolator 350 are loaded into respective ones of the registers 410 and 420. These registers are decremented at a fixed frequency Fdec. The outputs 412 and 422 from the modules 410 and 420 have a high logic level so long as the contents of the down-counting registers have not reached 0. The outputs 412 and 422 of the modules 410 and 420 change over to a low logic state once the corresponding counter has reached zero.

Two logic signals are thus obtained at the output 412 and 422 from the modules 410 and 420 whose high level durations are proportional to the sine and the cosine respectively of the desired angle of deflection.

Further, putting:

$(2^M) \times 1/(Fdec) = T_{RC}$.

a rectangular signal of frequency $1/T_{RC}$ is thus obtained at the outputs from the modules 410 and 420 having a duty ratio equal to the sine or the cosine as the case may be of the desired angle of deflection. The following values may be taken, for example: M=8 bits, Fdec=32768 Hz, and $1/T_{RC}$=128 Hz.

The purpose of the output logic block 450 is to control the power stages feeding the coils of the ratio meter.

Figure 7:
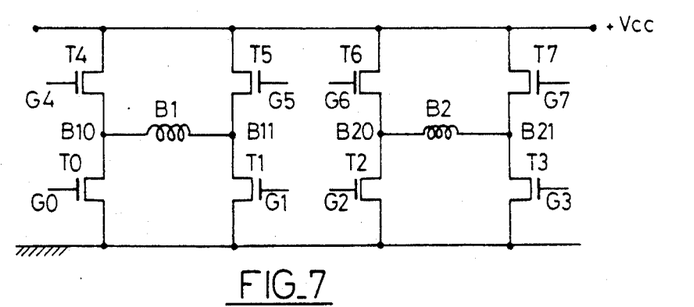
FIG. 7 is a circuit diagram showing the structure of the power stages feeding the coils of the ratio meter.

As shown in accompanying FIG. 7, these stages may be constituted by eight transistors T0 to T7 connected in pairs via their main conduction paths between a power supply terminal +Vcc and ground.

The two coils B1 and B2 are connected between the points common to associated pairs of transistors T0, T4; T1, T5; T2, T6; T3, T7.

The input of the output logic block 450 receives firstly the two most significant bits SQ(1) and SQ(0) of the signal from the slope limiting module 250, and secondly the signals Rcs and Rcc rom the modules 410 and 420.

The output logic block 450 determines the directions of the currents flowing through the coils B1 and B2 as a function of the required quadrant as identified by the two most significant bits SQ(1) and SQ(0) from the module 250.

For example, if these two bits are at levels 00, which corresponds to the first quadrant Q0, then the block 450 causes current to flow from B10 to B11 and from B20 to B21 as shown in FIG. 7, and it does this by switching on transistors T1, T4, T3, and T6.

If the two most significant bits from the modules 250 are at levels 01, corresponding to a second quadrant Q1, then the block 450 causes current to flow from B10 to B11 and from B21 to B20, and it does this by switching on transistors T1, T4, T2, and T7.

If the two most significant bits from the module 250 are at levels 10, which corresponds to a third quadrant Q2, then the block 450 causes current to flow from B11 to B10 and from B21 to B20, which it does by switching on transistors T0, T5, T2, and T7.

Finally, if the two most significant bits from the module 250 are at levels 11, which corresponds to a fourth quadrant Q3, then the block 450 causes currents to flow from B11 to B10 and from B20 to B21, which it does by switching on transistors T0, T5, T3, and T6.

Figure 8B:
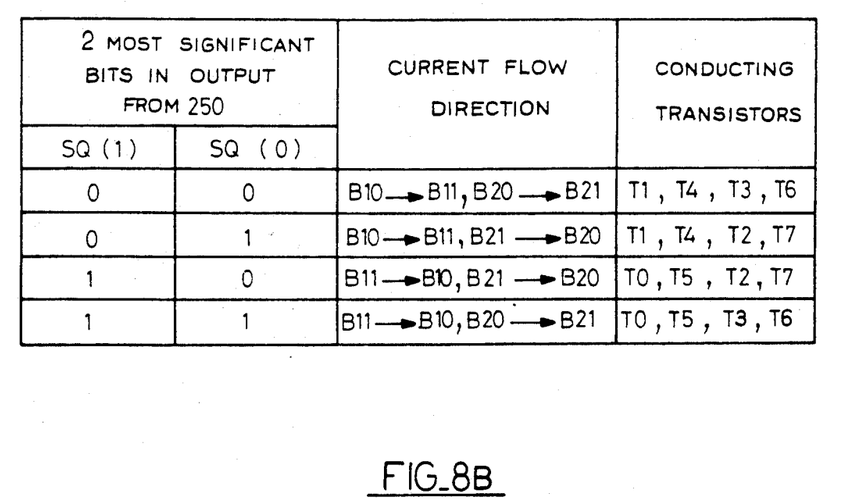
FIG. 8B is a table showing the directions of the currents flowing through the coils and identifying which power stages are conducting as a function of the quadrant under consideration.

These dispositions are summarized in FIG. 8B.

The modulus of the current flowing through each coil is given by the pulse-width modulation of a current I0 flowing through the conducting transistors as determined by the signals Rcs and Rcc from the modules 410 and 420, which signals are applied in an appropriate order to the bases or grids G0 to G7 of the transistors.

Figure 9:
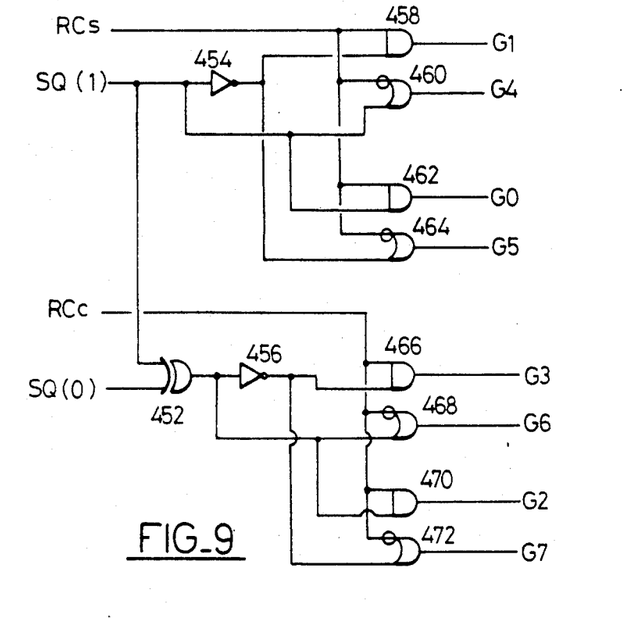
FIG. 9 is a circuit diagram of an output logic block.

To do this, the output logic block 450 may have the configuration shown in accompanying FIG. 9.

In FIG. 9, the module 450 comprises a two-input exclusive-OR gate 452, two inverters 454 and 454, four two-input AND gates 458, 462, 466, and 470, and four two-input OR gates, with one each of their inputs being an inverting input.

As shown in FIG. 9, the signal from the module 410 representing a sine is written RCs, and the signal from the module 420 representing a cosine is written RCc, with SQ(1) being the most significant bit from the module 250, and SQ(0) being the next most significant bit from the module 250.

The gate 452 receives the signals SQ(1) and SQ(0) on its inputs.

The inverter 454 receives the signal SQ(1) at its input, and the inverter 456 receives the signal SQ(0) at its input.

The inputs of the gate 458 receive the signal RCs and the signal from the inverter 454. The output from gate 458 is connected to the grid G1 of transistor T1.

The inverting input of gate 460 receives the signal RCs and its non-inverting input receives the signal SQ(1). The output from the gate 460 is connected to the grid G4 of transistor T4.

The inputs of gate 462 receive the signal RCs and the signal SQ(1). The output from the gate 462 is connected to the grid G0 of transistor T0.

The inverting input of gate 464 receives the signal RCs and its non-inverting input receives the signal from the inverter 454. The output of gate 464 is connected to the grid G5 of transistor T5.

The inputs of gate 466 receive the signal RCc and the signal from the inverter 456. The output from gate 466 is connected to the grid G3 of transistor T3.

The inverting input of gate 468 receives the signal RCc and its non-inverting input is connected to the output of the gate 452. The output from the gate 468 is connected to the grid G6 of transistor T6.

The inputs of gate 470 receive the signal RCc and the signal from the gate 452. The output from the gate 470 is connected to the grid Q2 of transistor T2.

The inverting input of gate 472 receives a signal RCc and its non-inverting input receives the signal from the inverter 456. The output from gate 472 is connected to the grid G7 of transistor T7.

Figure 10:
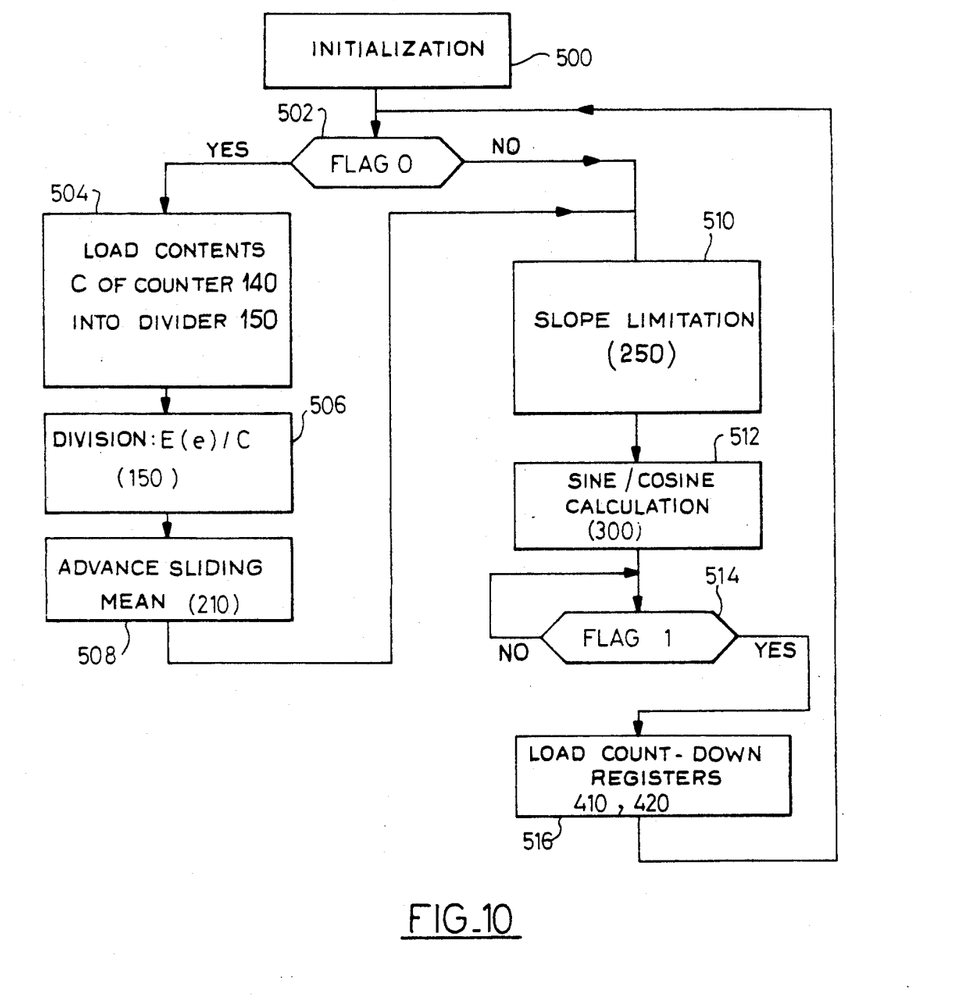
FIG. 10 is a flow chart showing the general operation of the circuit.

The control circuit is sequenced to operate as shown in accompanying FIG. 10.

With reference to FIG. 10, the appearance of an enable signal at the output of counter 140 or predivider 120 is called FLAG0, specifying that a value C is available at the output from the counter 140, and the appearance of an enable signal at the output from the modules 410 and 420 indicating that these modules are ready to receive new data from the encoding stage 300 is reference FLAG1.

In FIG. 10, step 500 is an initialization step.

At the following step 502, the system tests whether FLAG0 is true.

If so, it passes successively through steps 504 (loading the contents C of counter 140 into divider 150), 506 (preforming the division E(e)/C in the module 150), and 508 (advancing the sliding mean in the module 210).

Step 508 is followed by step 510.

Similarly, step 502 is followed by step 510 if step 502 finds the signal FLAG0 to be not true.

During step 510, the module 250 limits the slope of the signal as mentioned above. Step 510 is followed by step 512. This step corresponds to calculating the sine and the cosine in the encoding stage 300.

Step 512 is followed by step 514. During this step, the system tests whether FLAG1 is true.

If it is, it moves on to step 516 where it loads the down-counting registers 410 and 420. Step 516 is followed by step 502.

If the signal FLAG1 is not true when testing in step 514, then this step loops back to itself.

It may be observed that the slope limiter module 250 imposes an angular limitation. This is transformed into a limitation on the first derivative of the angle relative to time (i.e. a limitation on angular speed) by virtue of the stop loop 514 being inserted in the branch containing the slope limitation operation.

Naturally the present invention is not limited to the particular implementation described above but extends to any variant coming within its scope.

In a first variant, the module 210 establishing the sliding means may be placed before the programmable divider 150 instead of being after it.

In a second variant, the module 210 for establishing the sliding mean may be replaced by a module which generates a hysteresis effect, i.e. which takes account of the samples of the preceding module only if the samples differ from the immediately preceding samples by a predetermined threshold.

Figure 11:
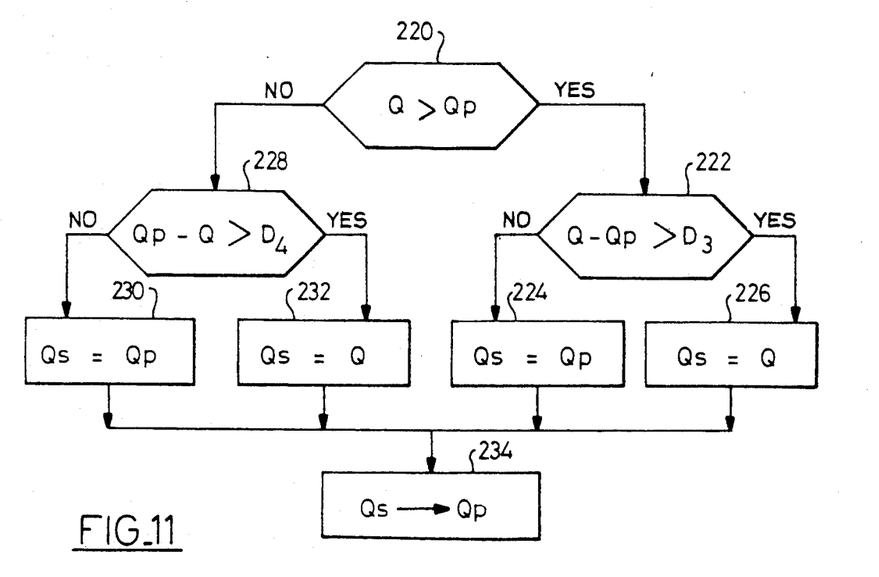
FIG. 11 is a flow chart showing the operation of a hysteresis module.

The operation of this variant of the module 210 is shown diagrammatically in accompanying FIG. 11.

With reference to FIG. 11, Q designates the sample from the module (140 or 150) preceding the hysteresis module 210, and Qp designates the preceding sample.

For this purpose, the sample Qp is stored in an appropriate register or memory cell. The module 210 provides a signal Qs at its output.

If at step 220 the module 210 determines that $Q > Qp$, then the slope of the signal is increasing and the system moves on to step 222 during which the module 210 compares the difference $Q - Qp$ with a predetermined threshold D3.

If $Q - Qp > D3$, then the increasing slope of the signal has reached the required threshold D3 and the module 210 then sets $Qs = Q$ at step 226.

Otherwise, if the module 210 determines at step 222 that $Q - QP \leq D3$, then the system moves on to step 224 which sets the signal $Qs = Qp$.

If at step 220, the module 210 determines $Q < Qp$, the slope of the signal is decreasing and the system moves on to step 228 during which the module 210 compares the difference $Qp - Q$ with a predetermined threshold D4.

If $Qp - Q > D4$, then the decreasing slope of the signal has reached the required threshold D4, and the module 210 then puts $Qs = Q$ at step 232.

Otherwise, if the module 210 determined during step 228 that $Qp - Q \leq D4$, the system moves on to step 230 which puts Qs equal to Qp.

At step 234, the previously stored value Qp is updated to the new value Qs. This value is directed to the module 250.

In a third variant, the means 310 may store tangent values sampled over 45° instead of sine and cosine values sampled over 90° as described above.

In this case, the maximum deflection of 360° is encoded on eight octants of 45° each, by using the three most significant bits from the module 250. The $r1 - 1$ bits of intermediate significance from the module 250 are used for addressing the means 310, thereby defining a value approximately equal to the tangent of the desired deflection. The r2 least significant bits are used for refining the value of the tangent by interpolating as described above.

One of the coils receives a current whose value is proportional to the resulting tangent, which current is referred to below as Ct. The other coil receives a reference current whose value is constant and equal to the current applied to the first coil for tan 45°. The reference current is referred to below as Cr. The current flow direction and the nature of the signals applied to the coils are then alternated in the following sequence:

1st octant: coil B1 receives Cr in a first direction coil B2 receives Ct in a first direction
2nd octant: coil B1 receives Cr in a first direction coil B2 receives Ct in a second direction
3rd octant: coil B1 receives Ct in a first direction coil B2 receives Cr in a second direction
4th octant: coil B1 receives Ct in a second direction coil B2 receives Cr in a second direction
5th octant: coil B1 receives Cr in a second direction coil B2 receives Ct in a second direction
6th octant: coil B1 receives Cr in a second direction coil B2 receives Ct in a first direction
7th octant: coil B1 receives Ct in a second direction coil B2 receives Cr in a first direction
8th octant: coil B1 receives Ct in a first direction coil B2 receives Cr in a first direction Where appropriate, the functional operations corresponding to the module 150, to the hysteresis version of the module 210, to the module 250, and to the module 350, may be performed by digital processing.

Finally, it may be observed that the values contained in the memory means 310 need not correspond accurately to a sine/cosine definition or to a tangent definition, but may be significantly offset from such theoretical definitions, should corrections be required, e.g. as a function of the characteristics of the ratio meter.

In the above description, the counter 140 using D bits, e.g. 20 bits, serves to count periods in the clock signal Fo/B from the divider 130. It is reset to zero by active edges, e.g. the rising edges of the signal from the predivider 120. On these active edges, the contents of the counter 140 is transferred into the divider 150.

In a variant, the counter 140 may operate on X bits, e.g. 10 bits, where $X < D$, and it may be associated with a Y-bit random access memory (RAM), e.g. Y=10 with X+Y=D, with the memory being incremented each time the X-bit counter overflows and thus representing the Y most significant bits of the initial counter 140 shown in FIG. 1.

We claim:

1. A circuit for controlling a ratio meter, the circuit comprising:

means for generating a digital signal representative of a parameter to be displayed;

memory means for storing a pre-defined encoding table representative of a sine, cosine, or tangent function to encode the digital signal, said memory means further storing therein $2^{r1}$ encoding values wherein r1 is the number of intermediate significant bits in the digital signal;

means to apply to addresses of said memory means said intermediate significant bits in the digital signal; and interpolation means for receiving the encoded signal and least significant bits of the digital signal, said interpolation means correcting the encoded signal from the memory means on the basis of the least significant bits of the digital signal, said corrected encoded signal used to control said ratio meter.

2. A ratio meter control circuit according to claim 1, wherein the memory means is selectable from a ROM, a PLA or a combinatory logic gate circuit.

3. A ratio meter control circuit according to claim 1, wherein the memory means comprises 16 sine or cosine values sampled at a pitch of 90°/16.

4. A ratio meter control circuit according to claim 1, wherein the pre-determined function is a sine/cosine function and the memory means is associated with a pointing logic circuit which, for an address N defined by the intermediate significant bits of the digital signal, reads a value contained at address N in the memory means if the second most significant bit of the digital signal has a first value, and reads a value contained at address $(2^{r1}-N)$ if the second most significant bit has a second value.

5. A ratio meter circuit according to claim 1, wherein the pre-defined function is a sine/cosine function and the two most significant bits of the digital signal determine an active quadrant of said ratio meter.

6. A ratio meter control circuit according to claim 5, wherein said ratio meter comprises coils for receiving the digital signal; and wherein the two most significant bits of the digital signal determine the direction of current flow in the coils of the ratio meter.

7. A ratio meter control circuit according to claim 1, wherein the pre-defined function is a tangent function and the three most significant bits of the digital signal determine the active octant of the ratio meter.

8. A ratio meter control circuit according to claim 7 wherein said ratio meter has two coils B1 and B2, and the circuit includes an output logic module which controls current flowing through the coils in such a manner that one of the coils receives a current Ct of value proportional to the tangent obtained, while the other coil receives a reference current Cr of constant value equal to the current applied to the first coil for tan 45°, the output logic module switching the direction of current flow and the nature of signals applied to the coils in accordance with the following sequence:

1st octant: coil B1 receives Cr in a first direction coil B2 receives Ct in a first direction 2nd octant: coil B1 receives Cr in a first direction coil B2 receives Ct in a second direction 3rd octant: coil B1 receives Ct in a first direction coil B2 receives Cr in a second direction 4th octant: coil B1 receives Ct in a second direction coil B2 receives Cr in a second direction 5th octant: coil B1 receives Cr in a second direction coil B2 receives Ct in a second direction 6th octant: coil B1 receives Cr in a second direction coil B2 receives Ct in a first direction 7th octant: coil B1 receives Ct in a second direction coil B2 receives Cr in a first direction 8th octant: coil B1 receives Ct in a first direction coil B2 receives Cr in a first direction 9. A ratio meter control circuit according to claim 1, wherein said ratio meter has at least two coils; and wherein the interpolation means has an output connected to at least two registers which are periodically loaded at a period TRC with sine and cosine function signals respectively output from the interpolation means, the two registers being decremented at a fixed frequency Fdec, outputs from each of the two registers changing level when the respective contents of the two registers reach zero, said outputs serving to control power stages feeding the coils.

10. A ratio meter control circuit according to claim 1, wherein said ratio meter has at least two coils; and wherein the interpolation means has an output connected to at least one register which is loaded periodically at a period TRC by a tangent function signal output from the interpolation means, the register being decremented at a fixed frequency Fdec, an output from the register changing level when the content of the register reaches zero, said output serving to control power stages feeding the coils.

11. A ratio meter control circuit according to claim 9 or 10, wherein $(2^M) \times 1/(Fdec) = TRC$ in which M represents a number of bits in the signal loaded into each register.

12. A ratio meter control circuit according to claim 11, wherein 1/TRC=128 Hz.

13. A ratio meter control circuit according to claim 9, further comprising an output module having a combinatory logic gate circuit which receives signals from the two registers together with the two most significant bits from the digital signal, and which controls the power stages feeding the coils.

14. A ratio meter control circuit according to claim 10, further comprising an output logic module having a combinatory logic gate circuit which receives a signal from the register together with the three most significant bits of the digital signal, and which controls the power states feeding the coils.

15. A ratio meter control circuit according to claim 13 or 14, wherein eight power stages are provided for feeding the coils.

16. A ratio meter control circuit according to claim 1, further comprising:

a counter for receiving a clock signal at fixed frequency at its clock input, and a signal whose frequency is related to the frequency of an input signal representing the parameter to be displayed at its control input, such that the counter counts clock pulses during the period when the input signal is being applied to its control input; and a divider for dividing a programmable constant E(e) by a signal provided from the counter so as to output a digital signal the output of the divider having a frequency representative of the frequency of the input signal.

17. A ratio meter control circuit according to claim 16, wherein number (H) of bits of the programmable frequency divider is greater than log (360/I)/log2, in which I represents a desired resolution.

18. A ratio meter control circuit according to claim 16, wherein the divider has a capacity of 20 bits.

19. A ratio meter control circuit according to claim 16, wherein the counter is associated with a memory which is incremented each time the counter overflows.

20. A ratio meter control circuit according to claim 16, wherein the programmable constant E(e) used by the programmable frequency divider is programed on e bits and has following form:

$$2^H(2^{h2}+h3)),$$

in which
h3 is an integer lying in the range 0 to $2^{e-1}$ as programmed by the e bits;
H represents the number of bits of the divider;
h2 = e; and
h1 is an integer such that h1 = H − e + 1.

21. A ratio meter control circuit according to claim 20, wherein the integer value h3 lying in the range 0 to $2^e − 1$ as programmed by the e bits is determined in such a manner that the maximum acceptable frequency at an output from the programmable frequency divider is equal to $Fe/2^{h1}(2^{h2}+h3)$ in which:
Fe represents the clock frequency applied to the input of the counter.

22. A ratio meter control circuit according to claim 20 or 21, wherein e = 6 bits.

23. A ratio meter control circuit according to claim 16, further comprising:
a programmable frequency divider having an input for receiving an input signal whose frequency is proportional to the parameter to be displayed and an output connected to the control input of the counter.

24. A ratio meter control circuit according to claim 23 wherein the programmable frequency divider has a division factor programmed in such a manner that maximum acceptable frequency at the output from the programmable frequency divider is equal to $Fe/2^{H+1}$, in which:
Fe represents the clock frequency applied to the input of the counter; and
H represents the number of bits of the divider.

25. A ratio meter control circuit according to claim 23, wherein the programmable divider provides an output of 10 bits.

26. A ratio meter control circuit according to claim 23, wherein the programmable frequency divider defines programming factors $2^A$ programmable on a bits where A is an integer lying in the range 0 to $(2^a − 1)$.

27. A ratio meter control circuit according to claim 26, wherein a = 2.

28. A ratio meter control circuit according to claim 1 wherein the memory means works cooperatively with a module responsive to a slope interpolated from the input digital signals representative of the parameter to be displayed.

29. A ratio meter control circuit according to claim 28, wherein the module responsive to the interpolated slope limits the slope of the signals which it delivers at its output.

30. A ratio meter control circuit according to claim 25, wherein the module responsive to the interpolated slope is a hysteresis module that takes no account of changes in the signals it receives at its input unless these changes exceed a determined threshold.

31. A ratio meter control circuit according to claim 29, wherein the module which limits the slope of the signal provides a 10 bit output signal.

32. A ratio meter control circuit according to claim 29, wherein the module which limits the slope of the signal compares a difference between a sample (AFm) which it receives at its input and a previously received sample (AFmp) with two thresholds (D1, D2) which are different depending on whether the slope of the signal is increasing or decreasing.

33. A ratio meter control circuit according to claim 29, wherein the module provides a 10 bit output signal.

34. A ratio meter control circuit according to claim 29, wherein the module compares the difference between a sample (AFm) which it receives at its input and a previously received sample (AFmp) with two thresholds which are different depending on whether the slope of the signal is increasing or decreasing.

35. A ratio meter control circuit according to claim 29, wherein the slope limiting module has its input connected to an output of a module which takes a sliding means of K samples.

36. A ratio meter control circuit according to claim 30, wherein the hysteresis module provides its output to a slope limiting module.

37. A ratio meter control circuit according to claim 30, wherein the hysteresis module uses different determined thresholds depending on whether the slope of the signal is increasing or decreasing.

38. A ratio meter control circuit according to claim 35, wherein K = 4.

39. A ratio meter control circuit according to claim 35, wherein the sliding mean module comprises K registers, two pointers containing addresses of a first and a last register to have received a sample, and an adder/subtractor driven by the pointers and whose contents correspond to a sum of the K registers.

40. A ratio meter control circuit according to claim 39, wherein during transfer to the slope limiter module, the contents of the adder/subtractor are shifted k bits to the right, such that $K = 2^k$.

41. A ratio meter control circuit according to claim 39, wherein during transfer to the slope limiter module, the contents of the adder/subtractor are shifted k bits to the right, such that $K = 2^k$.

42. A circuit for controlling a ratio meter, wherein said circuit comprises:
means for generating a digital signal representative of a parameter to be displayed;
memory means for providing a pre-defined sine or cosine function to encode the digital signal, the memory means being addressed by intermediate significant bits of the digital signal;
interpolation means using the least significant bits of the digital signal to correct the encoded signal from the memory means; and
at least two register means being periodically loaded at a period TRC by sine and cosine function signals provided respectively from the interpolation means, the two register means being decremented at a fixed frequency Fdec, outputs from each of the two register means changing level when the respective contents of the two register means reach zero, said outputs serving to control power stage feeding coils of said ratio meter, wherein $(2^M) \times 1/(Fdec) = TRC$ in which M represents the number of bits in the function signal loaded into each register means.

43. A circuit for controlling a ratio meter, wherein said circuit comprises:

means for generating a digital signal representative of a parameter to be displayed;

memory means for providing a pre-defined tangent function to encode the digital signal, the memory means being addressed by intermediate significant bits of the digital signal;

interpolation means using the least significant bits of the digital signal to correct the encoded signal from the memory means; and at least one register means being periodically loaded at the period TRC by tangent function signals provided from the interpolation means, the register means being decremented at a fixed frequency Fdec, output from the register means changing level when the contents of the register means reach zero, said output serving to control power stage feeding coils of said ratio meter, wherein $(2^M) \times 1/(Fdec) = TRC$ in which M represents the number of bits in the function signal loaded into each register means.

44. A circuit for controlling a ratio meter, wherein said circuit comprises:

a counter means for receiving a clock signal (Fe) at a fixed frequency at its clock input, and a signal whose frequency is related to the frequency of an input signal representing a parameter to be displayed at its control input, the counter means counting clock pulses during the period the signal is being provided to its control input;

a divider means for dividing a programmable constant E(e) by a signal output from the counter means so as to provide a digital signal at the output of the divider means which is representative of the frequency of the input signal;

memory means for providing a pre-defined sine, cosine or tangent function to encode the digital signal, the memory means being addressed by intermediate significant bits of the digital signal; and interpolation means using the least significant bits of the digital signal to correct the signal output from the memory means, said corrected signal used to control said ratio meter.

45. A ratio meter control circuit according to claim 44, wherein the number (H) of bits of the divider means is greater than log (360/I)/log2, in which I represents a desired resolution.

46. A ratio meter control circuit according to claim 44, wherein the divider means has a capacity of 20 bits.

47. A ratio meter control circuit according to claim 44, wherein the counter means is associated with a memory means which is incremented each time the counter means overflows.

48. A ratio meter control circuit according to claim 44, wherein the programmable constant E(e) used by the divider means is programmed on e bits and have following form:

$$2H(2^{h1}(2^2 + h3)).$$

in which:

h3 is an integer lying in the range 0 to $2^e - 1$ as programmed by the e bits;

H represents the number of bits of the divider means;

h2 = e; and h1 is an integer such that $h1 = H - e + 1$.

49. A ratio meter control circuit according to claim 48, further comprising:

a programmable frequency divider having an input for receiving an input signal whose frequency is proportional to the parameter to be displayed, and an output connected to the control input of the counter means; and wherein the integer value h3 lying in the range 0 to $2^e - 1$ as programmed by the e bits is determined in such a manner that the maximum acceptable frequency provided by the programmable frequency divider is equal to $Fe/2^{h1}(2^{h2} + h3)$ in which:

Fe represents the clock frequency applied to the input of the counter.

50. A ratio meter control circuit according to claim 48 or 47, wherein e = 6 bits.

51. A ratio meter control circuit according to claim 44, further comprising:

a programmable frequency divider having an input for receiving an input signal whose frequency is proportional to the parameter to be displayed, and an output connected to the control input of the counter means.

52. A ratio meter control circuit according to claim 51, wherein the programmable frequency divider has a division factor programmed in such a manner that maximum acceptable frequency at the output from the programmable frequency divider is equal to $Fe/2^{H+1}$, in which:

Fe represents the clock frequency applied to the input of the counter; and

H represents the number of bits of the divider.

53. A ratio meter control circuit according to claim 51, wherein the programmable frequency divider provides a 10 bit output.

54. A ratio meter control circuit according to claim 51, wherein the programmable frequency divider defines programming factors $2^A$ programmable on a bits where A is an integer lying in the range 0 to $(2^a - 1)$.

55. A ratio meter control circuit according to claim 54, wherein a = 2.

56. A circuit for controlling a ratio meter, comprising:

means for generating digital signals representative of parameters to be displayed;

a module responsive to a slope of the digital signals, said module being a hysteresis module that takes no account of changes in the values of the digital signals unless these changes exceed a determined threshold;

memory means using a pre-defined sine, cosine or tangent function to encode the digital signals output from said module, the memory means being addressed by respective intermediate significant bits of the digital signals; and interpolation means using the respective least significant bits of the digital signals to correct the encoded signals from the memory means, said corrected encoded signals used to control said ratio meter.

57. A ratio meter control circuit according to claim 56, wherein the hysteresis module has an output connected to an input of a slope limiting module.

58. A ratio meter control circuit according to claim 56, wherein the hysteresis module uses different determined thresholds depending on whether the interpolated slope of the digital signals is increasing or decreasing.

59. A circuit for controlling a ratio meter, wherein the circuit comprises:
 means for generating digital signals representative of parameters to be displayed;
 a first module for obtaining a sliding mean of K samples from said digital signal;
 a second module responsive to a slope interpolated from the digital signals provided from said first module to limit the slope of the digital signals provided at its output;
 memory means using a pre-defined sine, cosine or tangent function to respectively encode each of the digital signals output from the second module, the memory means being addressed by respective intermediate significant bits of the digital signals; and
 interpolation means using the respective least significant bits of the digital signals to correct the encoded signals output from the memory means, said corrected encoded signals used to control said ratio meter.

60. A ratio meter control circuit according to claim 59, wherein K=4.

61. A ratio meter control circuit according to claim 59, wherein the first module comprises K registers, two pointers containing addresses of a first and a last register to have received a sample, and an adder/subtractor driven by the pointers and whose contents correspond to a sum of the K registers.

* * * * *